(12) United States Patent
Woo

(10) Patent No.: US 8,686,541 B2
(45) Date of Patent: Apr. 1, 2014

(54) SEMICONDUCTOR DEVICE INCLUDING CAPACITOR AND CONTACT PLUG

(75) Inventor: Jai Yong Woo, Yongin (KR)

(73) Assignee: Hynix Semiconductor Inc., Icheon (KR)

( * ) Notice: Subject to any disclaimer, the term of this patent is extended or adjusted under 35 U.S.C. 154(b) by 0 days.

(21) Appl. No.: 13/181,691

(22) Filed: Jul. 13, 2011

(65) Prior Publication Data

US 2012/0012981 A1    Jan. 19, 2012

(30) Foreign Application Priority Data

Jul. 15, 2010    (KR) .................. 10-2010-0068367

(51) Int. Cl.
*H01L 21/02* (2006.01)

(52) U.S. Cl.
USPC ......................................... 257/532; 257/534

(58) Field of Classification Search
USPC ................................. 257/532, 534
See application file for complete search history.

(56) References Cited

FOREIGN PATENT DOCUMENTS

| KR | 1020030062087 A | 7/2003 |
| KR | 1020040065608 A | 7/2004 |
| KR | 1020050079433 A | 8/2005 |
| KR | 100568515 B1 | 3/2006 |

*Primary Examiner* — Ngan Ngo

(57) ABSTRACT

The present invention provides technology directed to a semiconductor device and a method of manufacturing the same. According to the present invention, metal contact plugs are formed to come into contact with both sidewalls of a capacitor, including lower electrodes, dielectric layers, and an upper electrode. Accordingly, contact resistance can be reduced because the contact area of the upper electrode and the metal contact plugs forming the capacitor, can be increased. Furthermore, the number of chips per wafer can be increased because the area in which the metal contact plugs and the capacitor are formed can be reduced. In addition, the generation of noise can be reduced because the contact area of the capacitor and the metal contact plugs is increased and thus voltage at the upper electrode is stabilized.

9 Claims, 3 Drawing Sheets

SEMICONDUCTOR DEVICE INCLUDING CAPACITOR AND CONTACT PLUG

CROSS-REFERENCE TO RELATED APPLICATION

Priority to Korean patent application number 10-2010-0068367, filed on Jul. 15, 2010, which is incorporated by reference in its entirety, is claimed.

BACKGROUND OF THE INVENTION

The present invention relates to a semiconductor device and a method of manufacturing the same.

Recently, in semiconductor devices such as DRAM, the degree of integration has increased. As a result, the area occupied by a unit cell is reduced, while required capacitance must be maintained or increased. A method of securing sufficient cell capacitance within a limited area may include, for example, a method of using high-k material as a dielectric layer, a method of reducing the thickness of a dielectric layer, a method of increasing the effective area of a lower storage electrode, and so on. From among these methods, the method of using high-k material requires use of new equipment, while also guaranteeing reliability and mass production of dielectric layers. For these reasons, the method of increasing the effective area of a lower electrode is often used because the existing dielectric layer can be used without change and the process is relatively simple.

The method of increasing the effective area of a lower electrode may include a method of making the lower electrode in a 3-D form, such as a cylinder form or a fin form, a method of growing Hemispherical Grain (HSG) in the lower electrode, a method of increasing the height of the lower electrode, and the like. Among these methods, the method of growing HSG is difficult to apply to a semiconductor device subject to a design rule of 0.14 µm or less because a bridge may form between the lower electrodes. For this reason, to improve cell capacitance, the method of making the lower electrode in a 3-D form and the method of increasing the height of the lower electrode are widely used. Among them, the method of forming the lower electrode in a cylinder form or a stack form is most widely used.

FIG. 1 is a cross-sectional view illustrating a conventional semiconductor device.

Referring to FIG. 1, a capacitor 140, including lower electrodes 110, dielectric layers 120, and an upper electrode 130, is formed on a semiconductor substrate 100. Metal contact plugs 150 are coupled to both ends of the upper electrode 130.

The metal contact plugs 150 do not cause damage to an upper portion of the capacitor when the metal contact plugs 150 are formed, but are disadvantageous for applying voltage to a central portion of the capacitor. This is because the metal contact plugs 150 are coupled only to ends of the upper electrode 130. Since the metal contact plugs 150 are coupled to the ends of lower portions of the upper electrode 130, voltage must pass through the sidewalls of the upper electrode 130 in order to apply voltage to the entire upper electrode 130. There are disadvantages in that, when the voltage passes through the sidewalls of the upper electrode 130, resistance is generated and the desired level of voltage is not properly transferred to the entire upper electrode 130. Furthermore, contact resistance is great because the contact area of the metal contact plugs 150 and the upper electrode 130 is small.

FIG. 2 is a cross-sectional view illustrating another conventional semiconductor device.

Referring to FIG. 2, a capacitor 240, including lower electrodes 210, dielectric layers 220, and an upper electrode 230, is formed on a semiconductor substrate 200. Metal contact plugs 250 are coupled to the top of the upper electrode 230.

The metal contact plugs 250 coupled to the top of the upper electrode 130 can stably transfer voltage to a central portion of the capacitor 240. However, the upper portion of the capacitor 240 is likely to be damaged by the metal contact plugs 250. Also, contact resistance is great because the contact area of the metal contact plugs 250 and the upper electrode 230 is small.

BRIEF SUMMARY OF THE INVENTION

The present invention provides a semiconductor device that includes a capacitor configured to include lower electrodes, dielectric layers, and an upper electrode on a semiconductor substrate, and contact plugs coupled to sidewalls of the upper electrode. The upper electrode comprises a first region and a second region.

Preferably, the first region and the second region have steps.

Preferably, the first region comes into contact with the semiconductor substrate and includes a region in which the lower electrodes and the dielectric layers are not formed.

Preferably, the second region is disposed over the lower electrodes, and includes the top of the lower electrodes.

Preferably, the contact plugs are coupled to the sidewalls of the upper electrode and the first region.

Preferably, the semiconductor device further includes a contact plug coupled to the second region.

A method of manufacturing a semiconductor device includes forming a capacitor, including lower electrodes, dielectric layers, and an upper electrode having a first region and a second region, on a semiconductor substrate and forming contact plugs coupled to the sidewalls of the upper electrode.

Preferably, the first region and the second region have steps.

Preferably, the first region comes into come into contact with the semiconductor substrate and includes a region where the lower electrodes and the dielectric layers are not formed.

Preferably, the second region is disposed over the lower electrodes.

Preferably, forming the contact plugs includes forming an insulating layer over the entire surface including the capacitor, forming contact holes by etching the insulating layer until the sidewalls of the upper electrode and the first region are exposed, and filling the contact holes with conductive material.

Preferably, the method further includes forming a contact plug coupled to the second region after forming the contact plugs coupled to the sidewalls of the upper electrode.

Preferably, the contact plugs are coupled to the sidewalls of the upper electrode and the first region.

DESCRIPTION OF EMBODIMENT

Figure 1:
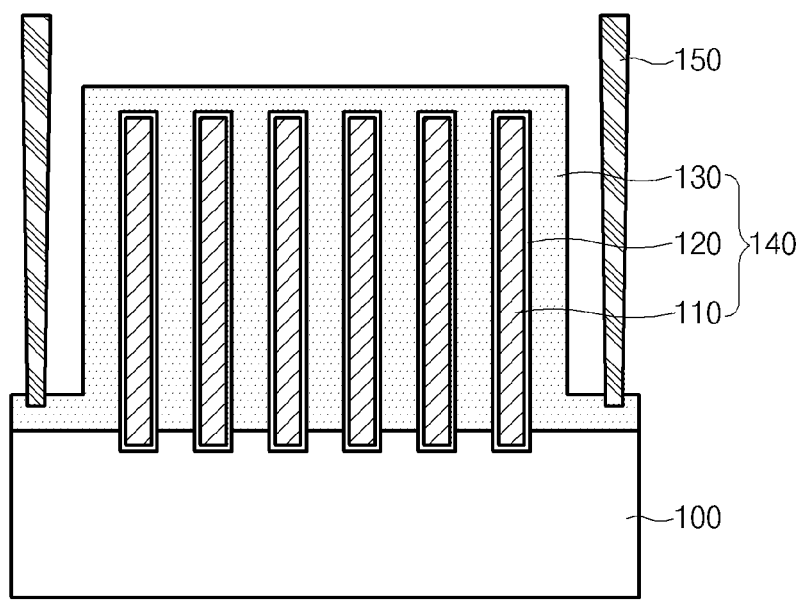
FIG. 1 is a cross-sectional view illustrating a conventional semiconductor device.
Figure 2:
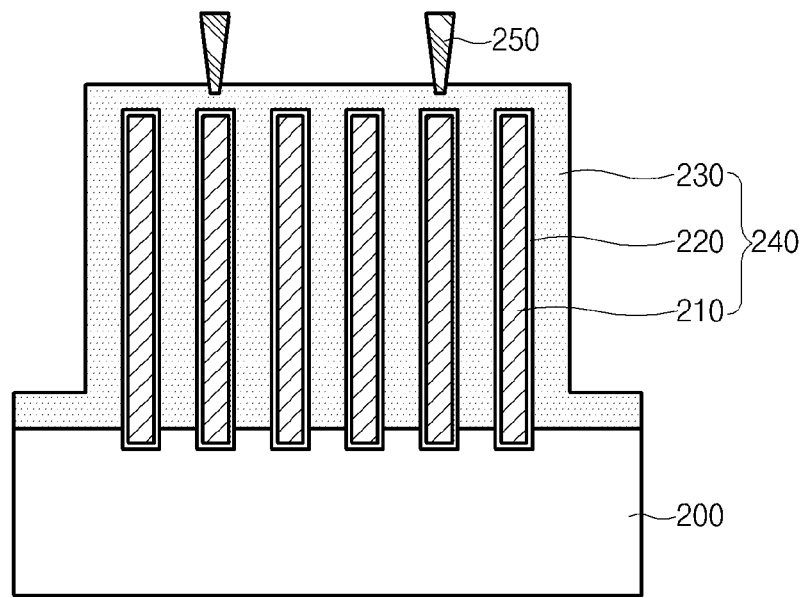
FIG. 2 is a cross-sectional view illustrating another conventional semiconductor device.

An exemplary embodiment of the present invention will now be described in detail with reference to the accompanying drawing. In the drawing, lengths and sizes of layers and regions may be enlarged or exaggerated for clarity. It will be understood that when an element, such as a layer, is referred to as being "on" another element, it can be directly on the other element or a third element may also be interposed therebetween. Furthermore, the same reference numerals are used throughout the entire specification to refer to the same parts.

Figure 3:
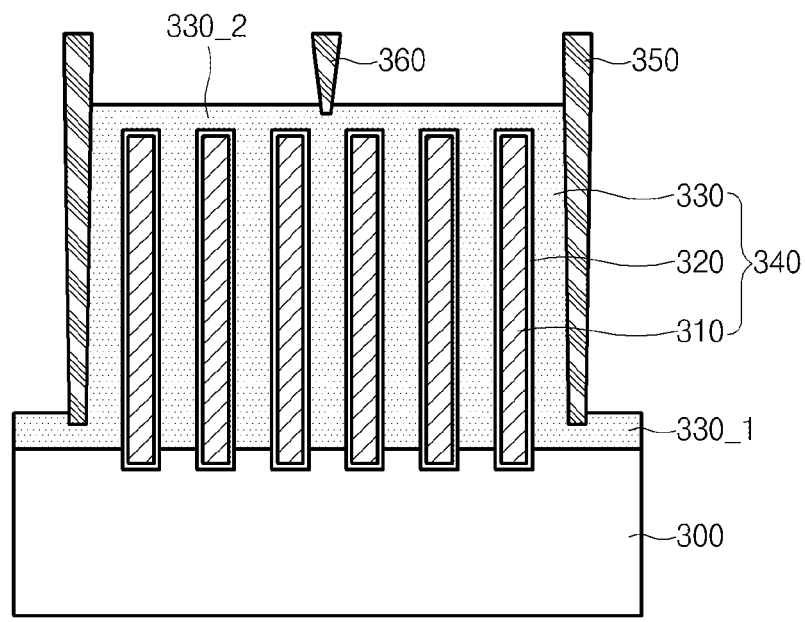
FIG. 3 is a cross-sectional view illustrating a semiconductor device according to the present invention.

FIG. 3 is a cross-sectional view illustrating a semiconductor device according to the present invention.

Referring to FIG. 3, a capacitor 340, including lower electrodes 310, dielectric layers 320, and an upper electrode 330, is formed over a semiconductor substrate 300. In an embodiment, the lower electrode 310 may be formed of a titanium (Ti) or titanium nitride (TiN) layer. Furthermore, it is preferred that the upper electrode 330 include a first region 330_1 and a second region 330_2. The first region 330_1 and the second region 330_2 are formed at different levels. The first region 330_1 comes in contact with the semiconductor substrate 300 and includes a region where lower electrodes 310 and dielectric layers 320 have not been formed. The second region 330_2 includes a region formed over the lower electrodes 310 and the dielectric layers 320.

After the capacitor 340 is formed, in an embodiment, metal contact plugs 350 are formed to come into contact with both sidewalls of the capacitor 340. When the metal contact plugs 350 are formed to come into contact with both sidewalls of the capacitor 340, the metal contact plugs 350 may be coupled to the first region 330_1. Furthermore, metal contact plugs 360 may also be formed in the second region 330_2. In detail, a method for forming metal contact plugs 350 comprises: forming an insulating layer over an entire surface including the capacitor; forming contact holes by etching the insulating layer until the sidewalls of the upper electrode 330 and the first region 330_1 are exposed; and filling the contact holes with conductive material.

When the metal contact plugs 350 are formed to come into contact with both sidewalls of the capacitor 340, the contact area of the metal contact plugs 350 and the capacitor 340 is increased, thereby reducing contact resistance. Furthermore, the number of chips per wafer can be increased because the distance between the metal contact plugs 350 and the capacitor 340 is reduced.

As described above, according to the present invention, the metal contact plugs are formed to come into contact with both sidewalls of the capacitor. Accordingly, contact resistance can be reduced because the contact area of the upper electrode and the metal contact plugs is increased. Furthermore, the number of chips per wafer can be increased because the distance between the metal contact plugs and the capacitor is reduced. In addition, noise can be reduced because the contact area of the capacitor and the metal contact plug is increased, and thus voltage can be stably applied to the upper electrode.

The above embodiments of the present invention are illustrative and not limitative. Various alternatives and equivalents are possible. The invention is not limited by the type of deposition, etching polishing, and patterning steps described herein. Nor is the invention limited to any specific type of semiconductor device. For example, the present invention may be implemented in a dynamic random access memory (DRAM) device or non volatile memory device. Other additions, subtractions, or modifications are obvious in view of the present disclosure and are intended to fall within the scope of the appended claims.

The present invention includes the following features.

1. A method of manufacturing a semiconductor device, comprising:

forming a capacitor, including a lower electrode, a dielectric layer, and an upper electrode having a first region and a second region, over a semiconductor substrate; and forming contact plugs coupled to sidewalls of the upper electrode.

2. The method according to claim 1, wherein the first region and the second region are formed at levels different from each other.

3. The method according to claim 1, wherein the first region comes into contact with the semiconductor substrate and includes a region where the lower electrode and the dielectric layer are not formed.

4. The method according to claim 1, wherein the second region is disposed over the lower electrode.

5. The method according to claim 1, wherein forming the contact plugs comprises:

forming an insulating layer over an entire surface of the semiconductor substrate including the capacitor;

forming contact holes by etching the insulating layer until the sidewalls of the upper electrode and the first region are exposed; and filling the contact holes with conductive material.

6. The method according to claim 1, further comprising forming a contact plug coupled to the second region, after forming the contact plugs coupled to the sidewalls of the upper electrode.

7. The method according to claim 1, wherein the contact plugs are coupled to the sidewalls of the upper electrode and the first region.

What is claimed is:

1. A semiconductor device, comprising:
a capacitor configured to include a lower electrode, a dielectric layer, and an upper electrode over a semiconductor substrate, wherein the upper electrode have a first region and a second region; and
first contact plugs couple to both sidewalls of the upper electrode and a second contact plug coupled to an upper side of the upper electrode.

2. The semiconductor device according to claim 1, wherein the first region and the second region are formed at levels different from each other.

3. The semiconductor device according to claim 1, wherein the first region is in contact with the semiconductor substrate and includes a region where the lower electrode and the dielectric layer are not formed.

4. The semiconductor device according to claim 1, wherein the second region is disposed over the lower electrode.

5. A semiconductor device, comprising:
an upper storage electrode pattern;
first and second connection patterns extending along first and second sidewalls of the upper storage electrode pattern and coupled to the first and second sidewalls of the upper storage electrode pattern, respectively; and
a third connection pattern coupled to an upper side of the upper storage electrode pattern,
wherein the first and the second connection patterns are configured to apply first and second signals to the upper storage electrode pattern.

6. The semiconductor device of claim 5, wherein the first and the second connection patterns and the first and the second sidewalk of the upper storage electrode pattern overlap by 50% or more.

7. The semiconductor device of claim 5, wherein the first and the second connection patterns and the first and the second sidewalls of the upper storage electrode pattern overlap by 90% or more.

8. The semiconductor device of claim 5, wherein the first and the second connection patterns and the first and the second sidewalls of the upper storage electrode pattern overlap by substantially all.

9. The semiconductor device of claim 5, wherein the third connection pattern extends parallel to the first connection pattern.

\* \* \* \* \*